(12) United States Patent
Kim et al.

(10) Patent No.: US 7,906,408 B2
(45) Date of Patent: Mar. 15, 2011

(54) METHOD OF MANUFACTURING STRAINED SILICON ON-INSULATOR SUBSTRATE

(75) Inventors: In Kyum Kim, Siheung-si (KR); Suk June Kang, Gumi-si (KR); Hyung Sang Yuk, Gumi-si (KR)

(73) Assignee: Siltron Inc. (KR)

( * ) Notice: Subject to any disclaimer, the term of this patent is extended or adjusted under 35 U.S.C. 154(b) by 41 days.

(21) Appl. No.: 12/195,229

(22) Filed: Aug. 20, 2008

(65) Prior Publication Data

US 2009/0053875 A1 Feb. 26, 2009

(30) Foreign Application Priority Data

Aug. 20, 2007 (KR) .................. 10-2007-0083630

(51) Int. Cl.
*H01L 21/30* (2006.01)
(52) U.S. Cl. ............. 438/458; 438/455; 257/E21.568
(58) Field of Classification Search .............. 438/458, 438/514, 455; 257/E21.568
See application file for complete search history.

(56) References Cited

U.S. PATENT DOCUMENTS

| | | | |
|---|---|---|---|
| 5,906,951 A | 5/1999 | Chu et al. | |
| 6,992,025 B2 | 1/2006 | Maa et al. | |
| 7,153,761 B1 * | 12/2006 | Nastasi et al. | 438/475 |
| 2002/0187619 A1 * | 12/2002 | Kleinhenz et al. | 438/471 |
| 2004/0171196 A1 * | 9/2004 | Walitzki | 438/137 |
| 2005/0053347 A1 * | 3/2005 | West et al. | 385/129 |
| 2005/0153524 A1 * | 7/2005 | Maa et al. | 438/458 |
| 2005/0245058 A1 * | 11/2005 | Lee et al. | 438/607 |
| 2006/0051960 A1 * | 3/2006 | Tweet et al. | 438/660 |
| 2006/0073674 A1 | 4/2006 | Fitzgerald et al. | |
| 2006/0079056 A1 * | 4/2006 | Kim et al. | 438/285 |
| 2006/0154450 A1 * | 7/2006 | Suzumura et al. | 438/478 |
| 2007/0026650 A1 * | 2/2007 | Hebras | 438/514 |

FOREIGN PATENT DOCUMENTS

| | | |
|---|---|---|
| EP | 1 777 735 A2 | 4/2007 |
| FR | 2 847 076 A1 | 5/2004 |
| JP | 2003-078116 A | 3/2003 |
| KR | 10-1998-0081556 A | 11/1998 |
| KR | 10-2005-0060982 A | 6/2005 |
| KR | 10-2005-0066932 A | 6/2005 |

OTHER PUBLICATIONS

European Search Report Issued on Jan. 23, 2009 of Corresponding European Patent Application No. 08162465.2-2203, 7 pages.
Notice of Allowance Issued on Nov. 28, 2008 of Corresponding Korean Patent Application No. 10-2007-0083630, 2 pages.

* cited by examiner

*Primary Examiner* — Thanh V Pham
*Assistant Examiner* — Duy T Nguyen
(74) *Attorney, Agent, or Firm* — Knobbe Martens Olson & Bear LLP

(57) ABSTRACT

Provided is a method of manufacturing a strained silicon-on-insulator (SSOI) substrate that can manufacture an SSOI substrate by separating a bonded substrate using a low temperature heat treatment. The manufacturing method includes: providing a substrate; growing silicon germanium (SiGe) on the substrate to thereby form a SiGe layer; growing silicon (Si) with a lattice constant less than a lattice constant of SiGe on the SiGe layer to thereby form a transformed Si layer; and implanting ions on the surface of the transformed Si layer, wherein, while growing of the SiGe layer, the SiGe layer is doped with impurity at a depth the ions are to be implanted. Accordingly, it is possible to manufacture a substrate with an excellent surface micro-roughness. Since a bonded substrate can be separated using low temperature heat treatment by interaction between implanted ions and impurity, it is possible to reduce manufacturing costs and facilitate an apparatus.

13 Claims, 5 Drawing Sheets

METHOD OF MANUFACTURING STRAINED SILICON ON-INSULATOR SUBSTRATE

CROSS-REFERENCE TO RELATED APPLICATION

This application claims the benefit of Korean Patent Application No. 10-2007-0083630, filed on Aug. 20, 2007, in the Korean Intellectual Property Office, the disclosure of which is incorporated herein by reference.

BACKGROUND OF THE INVENTION

1. Field of the Invention

The present invention relates to a method of manufacturing a strained silicon-on-insulator (SSOI) substrate, and more particularly, to a substrate with an excellent surface micro-roughness required for enhancement of a device characteristic and a method of manufacturing an SSOI substrate that can separate a bonded substrate using a low temperature heat treatment.

2. Description of Related Art

T. A. Langdo, et al. published a paper in Solid-state electronics 48 (2004) regarding a method and characteristic of manufacturing a strained silicon-on-insulator (SSOI), titled "Strained Si on insulator technology: from materials to devices".

The above technology initially grew a tilted silicon germanium (SiGe) layer on a silicon (Si) substrate, grew a relaxed SiGe layer on the tilted SiGe layer to contain a certain amount of germanium content, and then grew relaxed silicon on a top layer. Next, SSOI was manufactured by implanting ions into the relaxed SiGe layer, separating a bonded substrate from an ion implantation region of the relaxed SiGe layer after bonding with an oxidized silicon substrate and a thermal treatment thereof, and thereby forming a structure where a portion of the SiGe layer is left in the top layer, and removing the formed layer using diluted fluoride and a wet oxidation process at a temperature of less than or equal to about 800° C.

Also, U.S. patent application Ser. No. 6,992,025 B2 titled "Strained silicon-on-insulator from film transfer and relaxation by hydrogen implantation" discloses a method of manufacturing a strained silicon substrate by uniformly maintaining a germanium content when forming a SiGe layer on a silicon substrate, and then implanting hydrogen ions to thereby relax the SiGe layer, and growing strained Si. Next, in order to enhance the bonding strength when bonding the relaxed silicon substrate with an oxidized silicon substrate, a thermal treatment was performed for less than 14 hours at a temperature of about 250° C. and a bonded substrate was separated from an ion implantation region using thermal treatment for less than four hours at a temperature of about 400° C. Next, after a portion of the SiGe layer existing in the top layer was removed by dry etching, the thermal treatment was performed for less than one hour at a temperature of about 900° C. prior to chemical mechanical polishing (CMP) for enhancement of the surface roughness of the separated SiGe surface. Through the above process, an SSOI-structured substrate was finally manufactured by removing SiGe using wet etching.

The above-described technology relates to a separation and layer transfer technology using hydrogen ion implantation that implants ions into a strained silicon substrate among two substrates used for a manufacturing process and bonds the strained silicon substrate with an oxide substrate at room temperature. A layer transfer phenomenon corresponding to the ion implantation depth occurs in a bonded substrate via a predetermined process. A silicon oxide film and a transferred ion implantation layer, that is, a portion of SiGe and a strained Si layer exist on a single substrate. In this instance, a final SSOI-structured substrate may be provided by removing SiGe in the top layer.

In the above manufacturing process, separation and layer transfer technology using hydrogen ion implantation requires a relatively high temperature. Thus, a relatively long process time is required for raising, maintaining, and lowering the temperature. After the separation is completed, a characteristic value of the surface roughness is formed to be high. When the characteristic value of the surface roughness immediately after the separation is high, there may be a need for another process of removing SiGe and then improving the surface roughness. Accordingly, the process becomes complex, which may affect the movement of electrons and holes. Therefore, it may cause a mobility characteristic to be deteriorated when manufacturing a device.

BRIEF SUMMARY

An aspect of the present invention provides a method of manufacturing a strained silicon-on-insulator (SSOI) substrate that can manufacture a substrate with excellent surface micro-roughness required for enhancement of a device characteristic.

Another aspect of the present invention also provides a method of manufacturing an SSOI substrate that can implant ions in a layer doped with impurity during an epitaxial growth process and thereby can be readily separated even at a low temperature heat treatment.

According to an aspect of the present invention, there is provided a method of manufacturing a SSOI substrate, the method including: providing a substrate; growing silicon germanium (SiGe) on the substrate to thereby form a SiGe layer; growing silicon (Si) with a lattice constant less than a lattice constant of SiGe on the SiGe layer to thereby form a transformed Si layer; and implanting ions on the surface of the transformed Si layer, wherein, while growing of the SiGe layer, the SiGe layer is doped with impurity at a depth the ions are to be implanted.

The impurity may include any one of boron (B), phosphorus (P), and arsenic (As). When the impurity is supplied in a vapor state, the impurity may be constructed using at least one of diborane ($B_2H_6$) gas, phosphine ($PH_3$) gas, and arsine ($AsH_3$) gas. Also, a concentration of the impurity may be supplied within the range of about 1e15 $cm^{-3}$ to about 1e20 $cm^{-3}$. Desirably, the impurity may be supplied at a flow rate of about 10 sccm to about 300 sccm.

In this instance, it may be desirable to dope the impurity at a temperature of about 100° C. to about 1200° C. under pressure of about 1 Torr to about 760 Torr.

Also, it may be desirable that the ions include hydrogen ions ($H^+$, $H_2^+$), and a concentration of the hydrogen ions is about $10^{15}$ $cm^{-2}$ to about $10^{17}$ $cm^{-2}$.

Also, the SiGe layer may include: a grade layer with a germanium concentration increasing as the grade layer reaches an upper portion; and a uniform layer including the impurity layer, with the germanium concentration being uniformly maintained on the grade layer. The impurity layer may be formed on the uniform layer.

Also, it may be desirable to maintain the germanium concentration included in the grade layer to be about 10% to about 100%, to form the thickness of the uniform layer in about 0.1 μm to about 5 μm, and to form the uniform layer via an in-situ process.

Also, the growing of the SiGe layer and the forming of the transformed Si layer may be performed through an epitaxial growth.

According to another aspect of the present invention, there is provided a method of manufacturing an SSOI substrate, the method including: providing a first substrate; and a growing SiGe on the first substrate to thereby form a grade and uniform SiGe layer. In this instance, while the growing of the SiGe layer, the SiGe layer may be doped with impurity at a depth the ions are to be implanted. The method may further include performing a chemical mechanical polishing (CMP) process. Next, the method may include: growing Si with a lattice constant less than a lattice constant of SiGe on the SiGe layer to thereby form a transformed Si layer; implanting ions into the SiGe layer on the surface of the transformed Si layer; providing a second substrate formed with an oxide film; forming a bonded substrate by making the transformed Si layer face the oxide film and bonding the first substrate and the second substrate; thermally treating the bonded substrate to thereby separate the bonded substrate based on an ion implantation portion; and removing the SiGe layer to thereby complete the SSOI substrate comprising the transformed Si layer, the oxide film, and the second substrate.

The forming of the bonded substrate may further include: cleaning a bonded surface of the first substrate and the second substrate to thereby dry the bonded surface, prior to the bonding.

Also, the forming of the bonded substrate may further include: pressurizing the first substrate and the second substrate after the bonding.

The bonded substrate may be separated into two substrates based on the layer with the implanted ions via thermal treatment in the temperature of about 100° C. to about 600° C. In this instance, the layer with the implanted ions may denote a portion with a highest concentration of ions in the SiGe layer.

Also, it may be desirable to perform the thermal treatment at least once over one hour to a plurality of hours.

Also, the first substrate and the second substrate may use a silicon substrate.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION OF EMBODIMENTS

Figure 1:
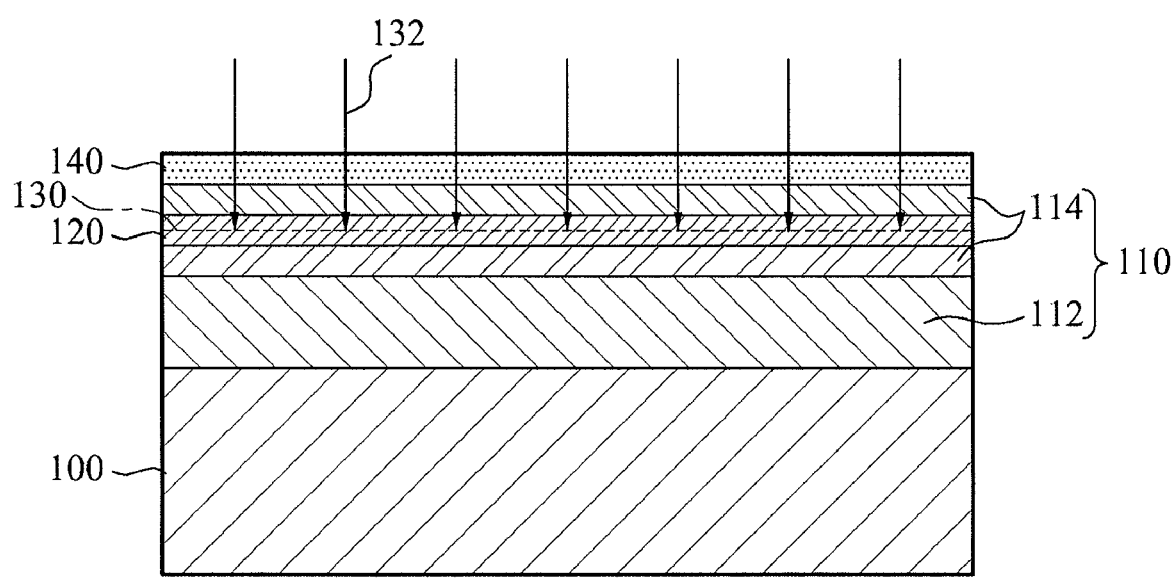
FIG. 1 is a cross-sectional view for describing a method of manufacturing a first substrate formed with a transformed silicon (Si) layer according to an embodiment of the present invention.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

A substrate used in the present invention may be a silicon substrate consisting of $SiO_2$, but the present invention is not limited thereto or restricted thereby.

FIG. 1 is a cross-sectional view for describing a method of manufacturing a first substrate 100 formed with a transformed silicon (Si) layer according to an embodiment of the present invention. As shown in FIG. 1, the first substrate 100 made of Si is provided. A silicon germanium (SiGe) layer 110 with grown SiGe is formed on the top surface of the first substrate 100. In this instance, SiGe may form a layer on the top surface of the first substrate 100 via an epitaxial growth. According to an aspect of the present invention, the thickness of the SiGe layer 110 may be within the range of hundreds of nm to a few μm.

The SiGe layer 110 includes a grade layer 112 with a germanium concentration increasing as the SiGe layer 110 is separated away from the first substrate 100, and a uniform layer 114 with the germanium concentration being uniformly maintained on the top surface of the grade layer 112. As the grade layer 112 reaches an upper portion, the germanium concentration increases, thereby increasing a lattice constant. Generally, the germanium concentration of the grade layer 112 may be within the range of about 10% to about 100%.

In this instance, for defect control, the SiGe layer 110 may include an SiGE layer with a low germanium concentration less than about 10%, or an Si layer without containing germanium between the first substrate 100 and the grade layer 112. It may be desirable to form the thickness of the SiGe layer with the low germanium concentration and the thickness of the Si layer without containing germanium to be within the range of hundreds of nm to a few μm.

The SiGe layer 110 may be formed to have two concentration patterns such as the grade layer 112 and the uniform layer 114, but the present invention is not limited thereto or restricted thereby. Also, the SiGe layer 110 may include only the grade layer 112 or may include only the uniform layer 114.

The SiGe layer 110 may be formed via an epitaxial growth. Hereinafter, a manufacturing process will be described in detail. Specifically, when the thickness of the uniform layer 114 is about 2 μm and the ion implantation depth is about 400 nm, the uniform layer 114 may be epitaxially grown by the thickness of about 1.5 μm via an in-situ process and then be divided into five layers with 100 nm and be epitaxially grown by the remaining thickness of about 0.5 μm. In this instance, a number of layers and thickness may be decreased or increased within the configurable range using equipment according to the ion implantation depth.

In this instance, when a depth of implanted ions is less than about 200 nm, it is possible to induce an interaction with implanted ions by doping impurity in the SiGe layer 110.

Desirably, the impurity doping may be performed in the high concentration of about $1e15\ cm^{-3}$ to about $1e20\ cm^{-3}$. In this instance, the impurity doping may use at least one of diborane ($B_2H_6$) gas, phosphine ($PH_3$) gas, and arsine ($AsH_3$) gas.

Silicon may be epitaxially grown on the uniform layer 114 with the doped impurity layer 120. In this instance, since a lattice constant of the SiGe layer 110 is greater than a lattice constant of silicon, growing silicon may receive stress in a growing direction to thereby grow into a transformed Si layer 140.

The transformed Si layer 140 may be grown by a desired thickness depending on a device to be formed on the SSOI substrate. Generally, the transformed Si layer 140 may have the thickness of tens of nm to hundreds of nm.

Prior to growing the transformed Si layer 140, a CMP process may be performed for polishing the surface of the SiGe layer 110.

An ion implantation region may be formed in the SiGe layer by implanting hydrogen ions ($H^+$ or $H_2^+$) 132 using an ion implantation scheme. Ions 132 may be implanted into an impurity layer 120. Through interaction between the implanted ions and the doped impurity, micro cracks may be generated, grown, and separated by thermal treatment. Specifically, impurity atoms of the impurity layer 120 function to trap a plurality of atoms of implanted ions. By the following thermal treatment, the trapped atoms may internally spread to thereby be separated based on the ion implantation region.

The concentration of hydrogen ions to be implanted may be, suitably, about $10^{15}$ cm$^{-2}$ to about $10^{17}$ cm$^{-2}$. It may also be desirable that the ion implantation energy consumed for the ion implantation is tens of KeV to hundreds of KeV. As the ion implantation energy increases, hydrogen ions may be deeply implanted into the substrate. By adjusting the ion implantation energy, it is possible to form the ion implantation region in the SiGe layer 110, or to form the ion implantation region in an SiGe layer without containing germanium, or an SiGe layer with a low germanium concentration, or to further form the ion implantation region in the first substrate 100.

A maximum depth the ion implantation region is formed is associated with a type and thickness of a layer to be removed after separating a substrate. Specifically, as the depth of ion implantation region is deeper, the thickness of the SiGe layer to be removed is thickened. Conversely, as the depth of ion implantation region is thinner, the thickness of the SiGe layer is thinner.

Also, since the implanted ions affect the transformed Si layer 140, it may be desirable to appropriately adjust an amount of ions to be implanted and ion implantation energy by collectively considering damage of the transformed Si layer 140 and the separated layer.

Figure 2:
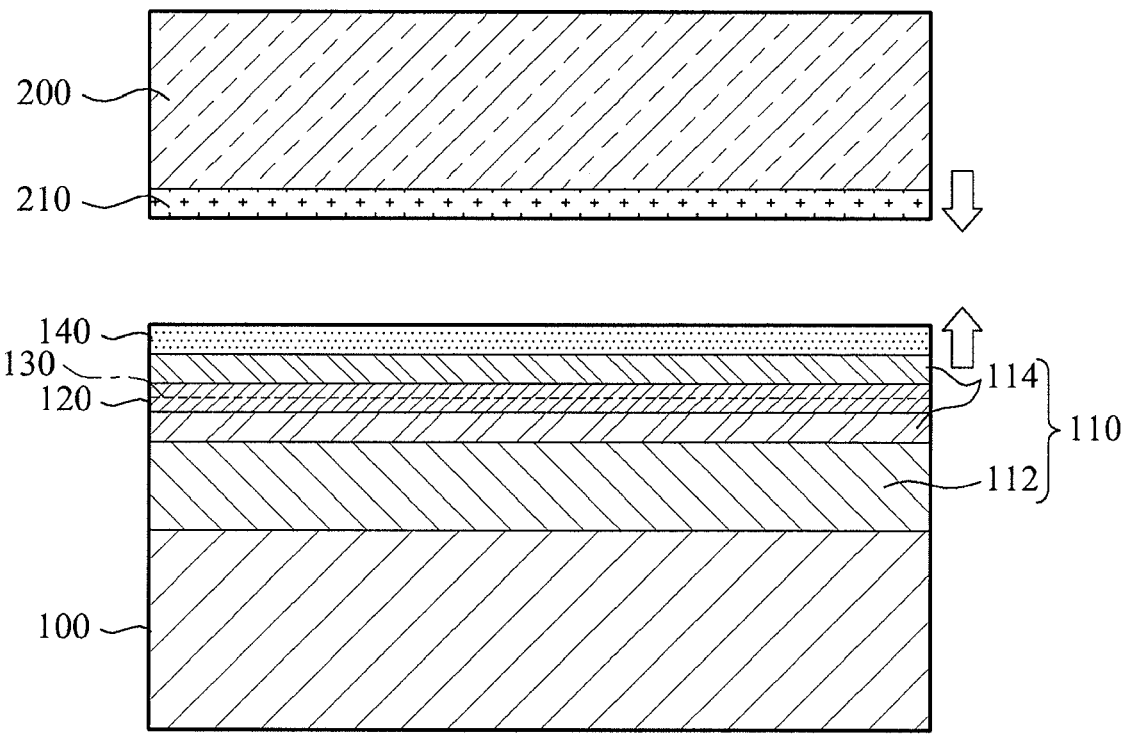
FIG. 2 is a cross-sectional view for describing a process of bonding the first substrate of FIG. 1 and a second substrate including an oxide film.

FIG. 2 is a cross-sectional view for describing a process of bonding the first substrate 100 of FIG. 1 and a second substrate 200 including an oxide film 210.

As shown in FIG. 2, the process makes the first substrate 100 formed with the transformed Si layer 140 in its upper portion face the second substrate 200 formed with the oxide film 210. Generally, the oxide film 210 may use a silicon oxide film consisting of $SiO_2$.

In this instance, the oxide film 210 may be formed by thermally oxidizing a silicon substrate. Also, the oxide film 210 may be formed by deposing $SiO_2$ on the silicon substrate. The oxide film 210 functions to electrically insulate devices formed on the SSOI substrate and is generally formed to have the thickness of about 100 nm to about 200 nm.

The first substrate 100 and the second substrate 200 form a bonded substrate by bonding the transformed Si layer 140 and the silicon oxide film 210 to face each other. Generally, prior to bonding the first substrate 100 and the second substrate 200, it may be desirable to clean and dry both bonded surfaces of the first substrate 100 and the second substrate 200 using pure water and a cleaning solution such as SC-1 and the like.

When the both bonded surfaces of the first substrate 100 and the second substrate 200 are lightly pressurized in a state where the both bonded surfaces face each other, a bonded region is spread along the both bonded surfaces, thereby more tightly bonding the first substrate 100 and the second substrate 200. The first substrate 100 and the second substrate 200 may be thermally treated in a relatively low temperature, for example, in the temperature of about 100° C. to about 600° C. for one hour or for tens of hours through a single step or two steps.

Figure 3:
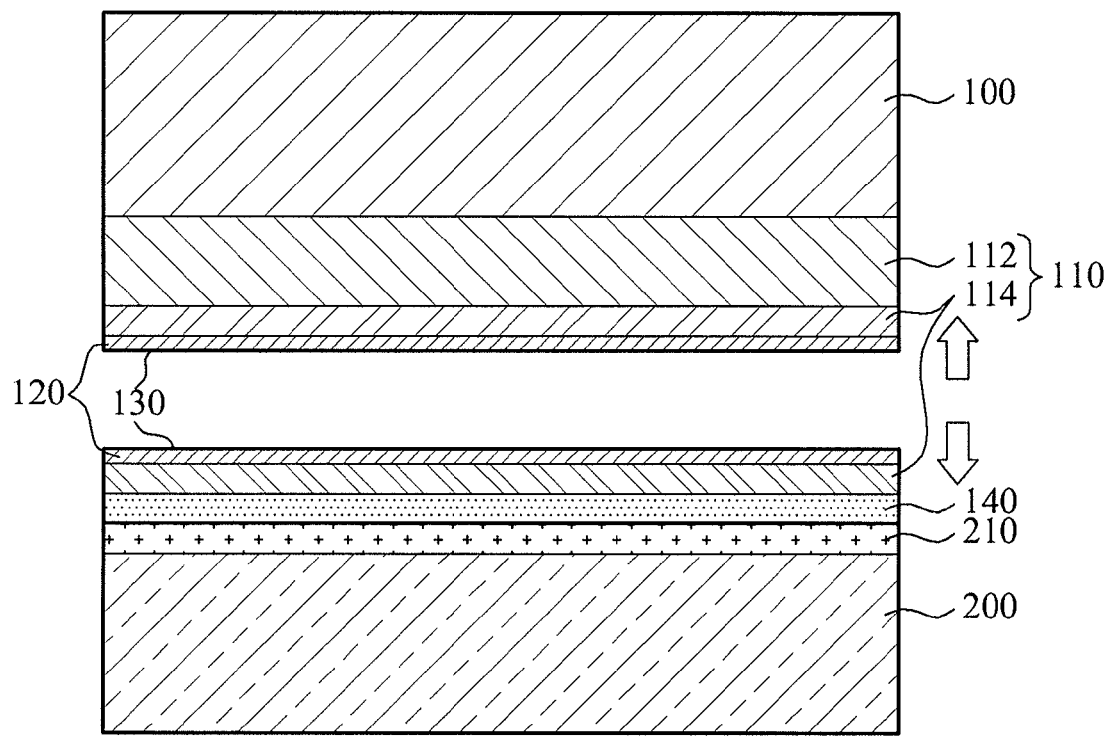
FIG. 3 is a cross-sectional view for describing a process of separating a bonded substrate from FIG. 2.
Figure 4:
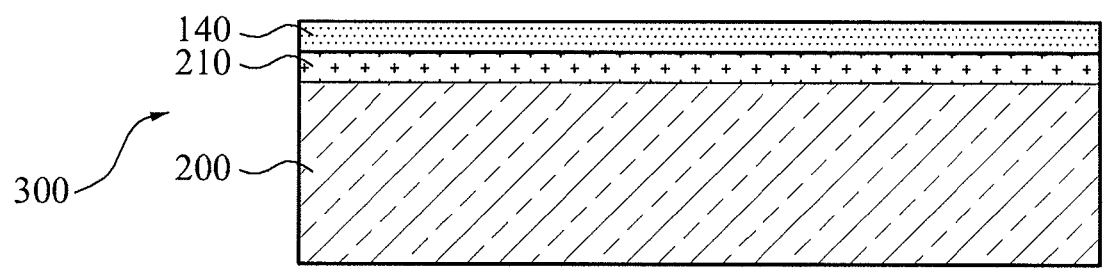
FIG. 4 is a cross-sectional view for describing a strained silicon-on-insulator (SSOI) substrate manufactured by removing an impurity layer and a silicon germanium (SiGe) layer from FIG. 3.

FIG. 3 is a cross-sectional view for describing a process of separating a bonded substrate from FIG. 2, and FIG. 4 is a cross-sectional view for describing an SSOI substrate manufactured d by removing the impurity layer 120 and the SiGe layer 110 from FIG. 3.

As shown in the figures, the first substrate 100 and the second substrate 200 may be separated from each other based on an ion implantation layer 130 with implanted ions. Specifically, when the bonded substrate formed by bonding the first substrate 100 and the second substrate 200 is thermally heated in a relatively low temperature state, for example, at a temperature of about 100° C. to about 600° C. for tens of minutes to a plurality of hours, micro cracks may be generated in the ion implantation layer 130. While the cracks are growing, the bonded substrate may be separated into two separate substrates.

In this instance, a separated surface of the bonded substrate is formed to have a roughness.

An SSOI substrate 300 where the transformed Si layer 140, the oxide film 210, and the second substrate 200 are sequentially disposed may be formed by removing the impurity layer 120 with the separated surface and the uniform layer 1140 using wet etching such as SC1 etching. In this instance, in addition to wet etching such as SC1 etching, a dry etching process may be performed. Also, a CMP process for enhancement of surface roughness may be performed. The method may be individually used or used in parallel.

Figure 5:
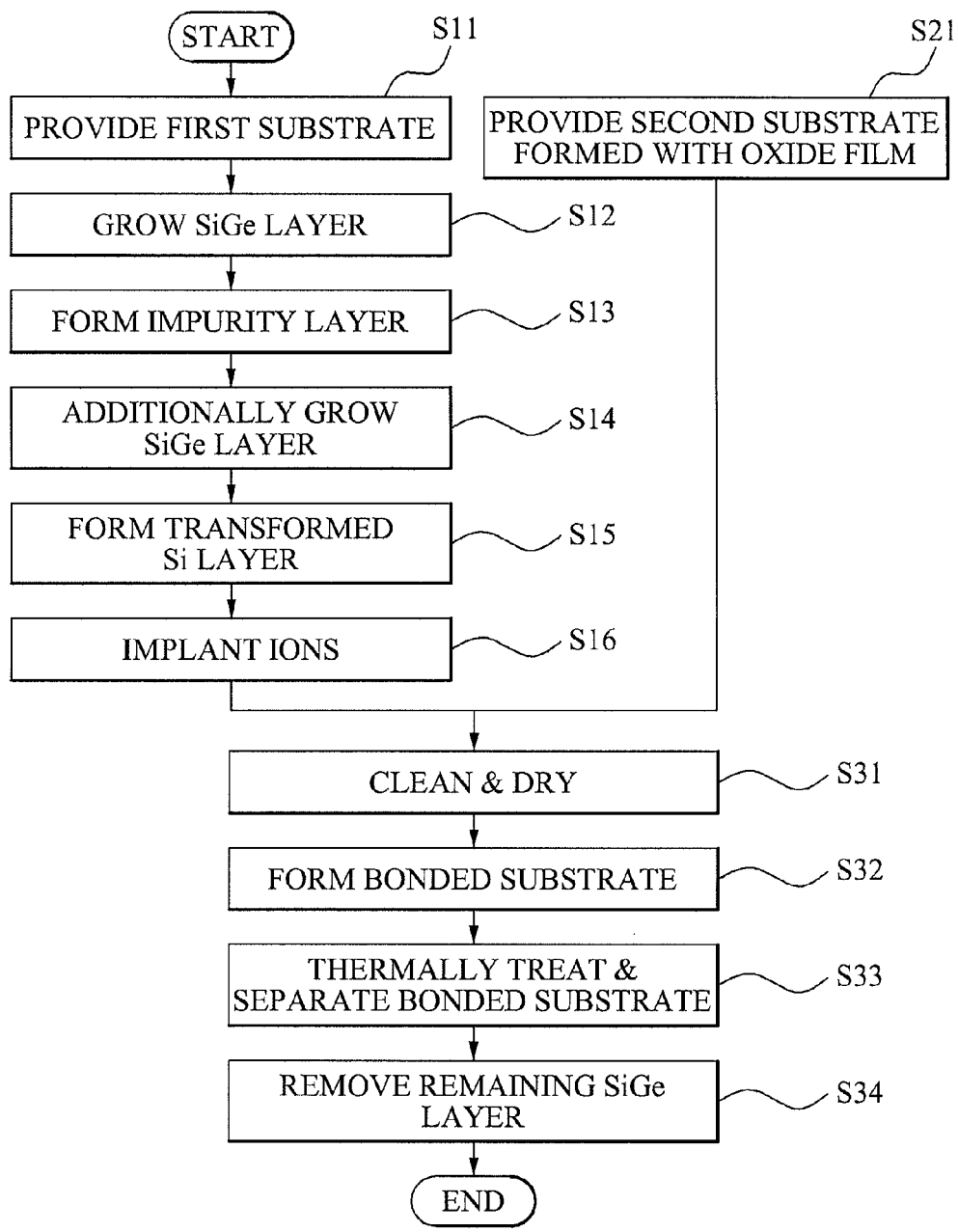
FIG. 5 is a flowchart illustrating a method of manufacturing an SSOI substrate according to an embodiment of the present invention.

FIG. 5 is a flowchart illustrating a method of manufacturing an SSOI substrate according to an embodiment of the present invention.

As shown in FIG. 5, the method may provide a first substrate made of silicon in operation S11. In operation S12, the method may grow a SiGe layer on the first substrate. The SiGe layer may include a grade layer with an increasing germanium concentration as the SiGe layer is separated away from the first substrate, and a uniform layer with a germanium concentration being uniformly maintained in an upper portion of the grade layer. After forming the uniform layer, the method may dope impurity in a thickness corresponding to the ion implantation depth to thereby form an impurity layer in operation S13. In operation S14, the method may form a SiGe layer with the uniform germanium concentration in an upper portion of the impurity layer through an in-situ process. In operation S15, the method may grow Si with a lattice constant less than a lattice constant of SiGe on the SiGe layer to thereby form a transformed Si layer. In operation S16, the method may implant ions into the impurity layer on the transformed Si layer to thereby form an ion implantation layer for separation. In operation S21, the method may provide a second substrate formed with an oxide film. In operation S31, the method may clean and dry the surface of the transformed Si layer and the surface of the oxide film. In operation S32, the method may form a bonded substrate by bonding the first substrate and the second substrate in a state where the transformed Si layer and the oxide layer face each other. In operation S33, the method may thermally treat the bonded substrate to thereby separate the bonded substrate based on the ion implantation layer. In operation S34, the method may remove the uniform layer and the impurity layer with the separated surface to thereby form an SSOI substrate where the transformed Si layer, the oxide film, and the second substrate are sequentially disposed.

As described above, according to the present invention, since a SiGe layer is doped with impurity and ions are implanted in an impurity layer, cracks may be more readily generated and grown due to an interaction between the implanted ions and the impurity such as boron and the like. Thus, separation may be enabled even in a low temperature.

Also, according to the present invention, since the roughness of a separated surface is relatively good, an additional surface processing operation such as dry etching, CMP, thermal treatment, and the like is not required. Thus, it is possible to reduce cost burden according to the additional process and to reduce a process required time, thereby contributing to a mass production.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A method of manufacturing a strained silicon-on-insulator (SSOI) substrate, the method comprising:
    providing a substrate;
    providing a silicon germanium (SiGe) layer comprising a doped SiGe sub-layer, which is doped with at least one impurity material selected from the group consisting of boron, phosphor and arsenide;
    growing, on the SiGe layer, silicon (Si) with a lattice constant less than a lattice constant of SiGe form a transformed Si layer; and
    injecting ions with an energy sufficient to send the injected ions to the doped SiGe sub-layer, wherein the injected ions interact with the impurity material to develop cracks in the doped SiGe sub-layer.

2. The method of claim 1, wherein the impurity material is doped using at least one of diborane ($B_2H_6$) gas, phosphine ($PH_3$) gas, and arsine ($AsH_3$) gas.

3. The method of claim 2, wherein a concentration of the impurity material is within the range of about 1e15 $cm^{-3}$ to about 1e20 $cm^{-3}$.

4. The method of claim 2, wherein the impurity material is supplied at a flow rate of about 10 sccm to about 300 sccm.

5. The method of claim 2, wherein the impurity material is doped under pressure of about 1 Torr to about 760 Torr.

6. The method of claim 2, wherein the impurity material is doped at a temperature of about 100° C. to about 1200° C.

7. The method of claim 1, wherein the ions comprise hydrogen ions ($H^+$, $H_2^{30}$), and a concentration of the hydrogen ions is about $10^{15}$ $cm^{-2}$ to about $10^{17}$ $cm^{-2}$.

8. The method of claim 1, wherein the SiGe layer comprises:
    a grade layer with a germanium concentration increasing as the grade layer reaches an upper portion; and
    a uniform layer with the germanium concentration being uniformly maintained on the grade layer, the uniform layer comprising the doped SiGe sub-layer.

9. The method of claim 8, where the germanium concentration included in the grade layer is within the range of about 10% to about 100%.

10. The method of claim 8, wherein the thickness of the uniform layer is about 0.1 μm to about 5 μm.

11. The method of claim 8, wherein the uniform layer is formed via an in-situ process.

12. The method of claim 1, wherein the providing of the SiGe layer and the forming of the transformed Si layer are performed through an epitaxial growth.

13. The method of claim 1, further comprising splitting at the doped SiGe sub-layer.

* * * * *